(12) United States Patent
Li

(10) Patent No.: US 9,374,064 B1
(45) Date of Patent: Jun. 21, 2016

(54) MICRO-STEP RESISTANCE NETWORKS

(71) Applicant: Texas Instruments Incorporated, Dallas, TX (US)

(72) Inventor: Qunying Li, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/633,066

(22) Filed: Feb. 26, 2015

(51) Int. Cl.
*H03K 5/00* (2006.01)
*H03H 11/24* (2006.01)

(52) U.S. Cl.
CPC .................................. *H03H 11/245* (2013.01)

(58) Field of Classification Search
USPC ............. 327/551–553, 556, 306, 308; 330/86
See application file for complete search history.

(56) References Cited

U.S. PATENT DOCUMENTS

| | | | | |
|---|---|---|---|---|
| 5,523,712 A | * | 6/1996 | Miyabe | H03G 3/001 327/350 |
| 6,693,491 B1 | * | 2/2004 | Delano | H03G 1/0088 330/254 |
| 7,239,196 B2 | * | 7/2007 | Hasegawa | H03H 11/1291 327/344 |

* cited by examiner

*Primary Examiner* — An Luu
(74) *Attorney, Agent, or Firm* — Lawrence J. Bassuk; Frank D. Cimino

(57) ABSTRACT

A series-structure, parallel-structure and combined structure of micro-step resistance network circuits is disclosed. Micro-step resistance is maintained, while the programming switches on-state resistance impact and its VC and TC effect are minimized. The programming switch area size is greatly reduced as compared to conventional systems.

20 Claims, 10 Drawing Sheets

MICRO-STEP RESISTANCE NETWORKS

BACKGROUND

The present disclosure relates generally to the design and use of micro-step resistance networks in high performance integrated circuits (ICs).

In Hard Disk Drive (HDD) servo IC design, accurate micro-step resistance networks are employed to help circuits meet both high performance and low IC area consumption requirements. Example HDD applications include Voice Coil Motor (VCM) current control loops and shock sensor resonance notch filters. In the VCM application they are used in a current sense amplifier to trim resistor accuracy in order to achieve a required Common Mode Rejection Ratio (CMRR). In the notch filter application they are used to tune the filter center frequency in order to cancel out a resonance tone caused by rotational vibration and generated at a shock sensor. The network resistance steps produced by micro-step resistance networks can be as small as a few ohms and the steps can be in a linear function, or they can follow other functions depending on the application.

Conventional systems will be described using FIG. 1 through FIG. 4.

FIG. 1 shows graph 100, which illustrates basic responses of a micro-step resistance network.

As shown in the figure, graph 100 includes an x-axis 102, a y-axis 104, a resistance value 106, a resistance value 108, a curve 110 and a curve 112.

X-axis 102 represents a resistance programming code, y-axis 104 represents resistance.

Curve 110 and curve 112 are both curves of micro-step resistance, adjustable in steps across a range of resistance values where resistance value 106 represents the minimum resistance ($R_{min}$) and resistance value 108 represents the maximum resistance ($R_{max}$) of the adjustment range, i.e., the adjustment range limits.

Curve 110 and curve 112 are adjustable by applying a resistance programming code to the micro-step network circuit, each programming code representing a resistance level. An example of a programming code is a simple sequence of binary codes such as 000, 001, 010, 011 . . . with each binary code applying a different resistance level.

It should be noted that curve 110 is a linear curve in which all the resistance level steps (i.e., the riser portions of the steps) are equal, while curve 112 is a non-linear curve where the steps are unequal.

FIG. 2 shows a conventional, basic, linear micro-step circuit 200.

As shown in the figure, circuit 200 includes an input 202, an output 204, a tapped resistor array 206, a tapped switch array 208, a resistor 210, a switch 212 and a head resistor 214.

Tapped resistor array 206 is arranged in series with head resistor 214 between input 202 and output 204. Tapped switch array 208 is arranged in parallel with tapped resistor array 206. The taps of tapped switch array 208 and tapped resistor array 206 are connected such that each individual switch is arranged in parallel with its corresponding individual resistor.

Tapped resistor array 206 contains 128 tapped resistors arranged in series. Tapped switch array 208 contains 128 tapped switches arranged in series.

Head resistor 214, resistor 210 and all other individual resistors of tapped resistor array 206 are operable to provide electrical resistance to a current. Switch 212 and all the other individual switches of tapped switch array 208 are operable to provide an electrical connection or disconnection depending on the closed (on) or open (off) state, respectively, of the switch.

In operation, the functions of resistor 210 and switch 212 should be assumed to be representative of other resistors and switches of the arrays. With switch 212 in the open state, the resistance R of resistor 210 is added to the total resistance between input 202 and output 204. With switch 212 closed, however, the resistance R of resistor 210 is not added to the total resistance between input 202 and output 204. Similarly, the resistance of any individual resistor of tapped resistor array 206 is added, or not added, to the total resistance between input 202 and output 204 depending on whether the resistor's corresponding switch (of tapped switch array 208) is in the open or closed state, respectively. For ideal switches, i.e., switches with on-state resistance ($R_{SWon}$)=0Ω, the minimum resistance of the micro-step circuit, i.e., the minimum resistance between input 202 and output 204, is the resistance of head resistor 214 with all switches closed. The maximum resistance is the sum of all the resistors of tapped resistor array 206 plus the head resistor with all switches open. It should be noted that at any instant, the combined states of the all switches of tapped switch array 208 represents a resistance programming code such as the one referred to in FIG. 1.

In practice, the switches are not ideal and can have an appreciable $R_{SWon}$ value. This can significantly affect, adversely, the step accuracy of any micro-step resistance network. To minimize the inaccuracy, $R_{SWon}$ needs to be as small as possible and definitely much smaller than the nominal resistance value it is switching in or out of the circuit, e.g. $R_{SWon}$ of switch 212 needs to be much smaller than the resistance, R, of resistor 210 of FIG. 2. For instance, if R=100Ω for resistor 210, then, for a step accuracy of 10%, $R_{SWon}$ must be 10Ω or less for switch 212.

However, there is a trade off in the size of circuit real-estate to $R_{SWon}$. For example, if an NMOS device and a PMOS device (each with 20Ω) are tied in parallel to form a transmission gate switch of $R_{SWon}$=10Ω, and assuming the voltage driving the MOS gates is 1.8V, the threshold voltage $V_T$ is 0.5V, the signal level Vs passing through the switch is 0.9V and device length $L_n$=0.2 μm, then:

$$R_{SWON\_NMOS} = \frac{1}{K'_n(W_n/L_n) \times (V_G - V_S - V_T)} = \qquad (1)$$

$$\frac{1}{160 \times 10^{-6} \times (W_n/L_n) \times (1.8 - 0.9 - 0.5)} \leq 20\Omega$$

The above calculation results in a physical NMOS device width $W_n$=156.25 μm. Since for PMOS, $K''_p$ is about four times smaller than that of NMOS ($K'_n$), then the PMOS device will have a 4× larger size, i.e., $W_p$=625 m.

It should be noted that in equation (1), the NMOS on-state resistance is a function of $K'_n$ which is proportional to the semiconductor carrier mobility, and typically becomes 2× smaller when the circuit temperature is raised from room temperature (27° C.) to 1250° C. In addition, the device threshold $V_{th}$ also varies with temperature. These temperature effects affecting $R_{SWon}$ are defined as temperature coefficients (TCs). The NMOS on-state resistance is also a function of the signal level (Vs) passing through the switch, which is assumed to be fixed 0.9V in equation (1) for simplicity of the calculation. However, in practice Vs may vary from 0V to 1.8V (in a transmission gate switch, NMOS device work for Vs ranges from 0V to 1.8-Vth=1.3V and PMOS device works for Vs ranges from $V_{th}$=0.5V to $V_{dd}$=1.8V). To ensure the micro-step network accurately works over a certain temperature range and a certain signal level range, i.e., that it overcomes temperature coefficients and voltage coefficients, the actual switch size may need to be 4× larger than that the size calculated in equation (1), i.e., $W_n$=625 um and $W_p$=2500 um. Such large sizes are not acceptable in high-volume low-cost IC design.

Other conventional micro-step resistor network implementations will now discussed with reference to FIGS. 3-4.

FIG. 3 shows a first alternate example of a conventional micro-step resistance network circuit 300.

As shown in the figure, circuit 300 includes input 202, output 204, tapped resistor array 206, resistor 210, switch 212, head resistor 214, a switch 302, a switch array 304, a switch 306 and a switch 308.

Switch 302 is arranged in parallel with resistor 210 and the second resistor of tapped resistor array 206. This arrangement pattern, i.e., a switch arranged between output 204 and each of the resistors of tapped resistor array 206 is repeated for all switches in switch array 304. At the end of the pattern sequence, switch 306 is arranged in parallel with resistor 210 and all the resistors of tapped resistor array 206 except the last one, and switch 308 is arranged in parallel with resistor 210 and all the resistors of tapped resistor array 206.

Tapped resistor array 206 contains 128 tapped resistors arranged in series. Switch array 306 contains 124 switches and so with switch 212, switch 302, switch 304 and switch 306 there are a total of 128 switches.

Switch 212, switch 306, switch 308 and all the other individual switches of switch array 304 are operable to provide an electrical connection or disconnection depending on the closed or open state (respectively) of the switch.

In operation, circuit 300 differs from circuit 200 of FIG. 2 in that each switch controls the insertion or non-insertion of a different number of resistors each of value R, into the total resistance between input 202 and output 204. This means that for any of the possible values of total resistance only one switch need be closed.

It should be noted that for circuit 300, the least significant switches (those that switch the fewer number of resistors of tapped resistor array 206) the $R_{SWon}$ and therefore the switch size problem remains as for circuit 200. However, for the most significant switches, the problem is relieved somewhat due to the larger difference between $R_{SWon}$ and the resistance being switched.

FIG. 4 shows a second alternate example of a conventional micro-step resistance network circuit 400.

As shown in the figure, circuit 400 includes input 202, output 204, a tapped resistor array 402, a tapped switch array 404, resistor 210, switch 212 and head resistor 214.

Tapped resistor array 402 is arranged in series with head resistor 214 between input 202 and output 204. Tapped switch array 404 is arranged in parallel with tapped resistor array 402. The taps of tapped switch array 404 and tapped resistor array 402 are connected such that each individual switch is arranged in parallel with its corresponding individual resistor.

Head resistor 214, resistor 210 and all other individual resistors of tapped resistor array 402 are operable to provide electrical resistance to a current. Switch 212 and all the other individual switches of tapped switch array 404 are operable to provide an electrical connection or disconnection depending on the closed or open state (respectively) of the switch.

It can be seen that circuit 400 is very similar in arrangement to circuit 200 of FIG. 2. The difference is in the resistance values of the individual resistors of the tapped resistor arrays. Rather than being all of the same value as in tapped resistor array 206, the values within tapped resistor array 402 follow a binary scaled progression from output to input as shown. Operation of the two circuits is also similar.

As for circuit 400 of FIG. 4, there can be a size problem for the least significant switches towards the output end of circuit 400, while at the input end, this problem is relieved for the most significant switches due the larger resistances being switched.

The circuits described so far have been series resistance circuits. In some applications, parallel resistance circuits are used for micro-step resistor networks. This will be described in greater detail with reference to FIGS. 5A-B.

FIG. 5A shows a conventional 3-bit parallel micro-step resistor network circuit 500.

As shown in the figure, circuit 500 includes input 202, output 204, a resistor 502, a resistor array 503 and a switch array 509. Resistor array includes a resistor 504, a resistor 506 and a resistor 508. Switch array 509 includes a switch 510, a switch 512 and a switch 514.

Resistor 502, resistor 504 resistor 506 and resistor 508 are arranged in parallel with each other between input 202 and output 204. Switch 510 is arranged between resistor 504 and input 202, switch 512 is arranged between resistor 506 and input 202, and switch 514 is arranged between resistor 504 and input 202.

Resistors 502, 504, 506 and 508 are operable to provide electrical resistance to a current. Switches 510, 512 and 514 are operable to provide an electrical connection or disconnection depending on the closed or open state (respectively) of the switch.

In operation, a programming code 516, which is a 3-bit code ($b_0$, $b_1$, $b_2$), is applied to switches 510, 512 and 514 controls their states to allow resistors 504, 506 and 508 respectively to contribute (or not) to the overall circuit resistance between input 202 and output 204. Since resistors are in parallel, $R_0$ is the maximum overall resistance limit with all switches open, the overall resistance reduces as resistances are switched in (switch closures) and the minimum overall resistance of the circuit is attained when all switches are closed.

An advantage of the parallel structure network is that small steps can be achieved with large resistance values, so when compared with series structures, $R_{SWon}$ and the corresponding switch size issues are greatly relieved. However, the main disadvantage of a parallel structure network is that the curve produced can be non-linear, i.e., there are variations in step size. This will be explained using a smaller micro-step resistor network using a 2-bit code.

FIG. 5B shows a conventional 2-bit parallel micro-step resistor network circuit 501.

As shown in the figure, circuit 501 includes resistor 502, resistor 504, resistor 506, a switch 510 and switch 512.

All components of circuit 501 are arranged and are operable as described for circuit 500 of FIG. 5A.

Circuit 501 is a modified version of circuit 500 with the last parallel resistor and switch removed, and, while it has a fewer number of branches, it operates in the same manner as circuit 500 but uses a 2-bit programming code (515) instead of a 3-bit programming code (516). The non-linear steps of the parallel-structure can be seen from the following equation which represents the circuit:

$$R_{effective}[b1b0] = \frac{1}{\frac{1}{R0} + b1 \times \frac{1}{R1} + b0 \times \frac{1}{R2}} \quad (2)$$

where programming codes applied to $[b_1b_0]$=00, 01, 10, 11. While the denominator portion of equation (2) increments linearly, the steps of $R_{effective}$, are non-linear. For example, if $R_0$=1 kΩ, $R_1$=50 kΩ and $R_2$=100 kΩ, then the step from $R_{effective}$ $[b_1b_0]$=00 to $R_{effective}$ $[b_1b_0]$=01 is 10Ω, while the step from $R_{effective}$ $[b_1b_0]$=01 to $R_{effective}$ $[b_1b_0]$=11 is 9.1Ω, a 10% difference.

Conventional implementations of series-structure micro-step resistance networks in integrated circuits are subject to a trade-off between large inaccuracies in step size on the one hand and large switch implementation sizes on the other. This is due to the inverse relationship between switch on-resistance and physical switch size and that this problem is further exacerbated when the operational ranges of temperature and voltage are taken into account due to the large effect of temperature and voltage coefficients.

While parallel structure micro-step networks can go a long way towards mitigating such problems, large variations in step size due to the non-linear response of these structures then becomes a significant implementation disadvantage.

What is needed are systems and methods which can be used to implement accurate micro-step series resistance networks without the size problems of conventional implementations as well as systems and methods which can implement parallel micro-step resistor networks which significantly reduce the variation in step size caused by the conventional parallel structure's non-linear response.

BRIEF SUMMARY

The present disclosure provides novel systems and methods for the implementation of accurate micro-step series resistance networks without the size problems of conventional implementations and which can produce parallel micro-step resistor networks which significantly reduce the variation in step size caused by the conventional parallel structure's non-linear response.

One aspect of the present disclosure is drawn to the use of additional inverse-driven series switches applied to the conventional series structure micro-step resistor circuit in order to compensate for the adverse effects of switch on-resistances.

Another aspect of the disclosure is drawn to the use of additional branches applied to a conventional parallel structure micro-step resistor circuit components and applying adaptively controlled switching techniques in order to make the step size more linear.

Another aspect of the disclosure is drawn to the use of additional "redundant" branches to a conventional parallel structure micro-step resistor circuit and applying redundant interpolation techniques when applying programming in order to make the step size linear.

Another aspect of the disclosure is drawn to the use of the additional "redundant" branches to a conventional parallel structure micro-step resistor circuit and applying redundant interpolation techniques when applying programming in order to tailor the step size curve to a desired function.

Additional advantages and novel features of the disclosure are set forth in part in the description which follows, and in part will become apparent to those skilled in the art upon examination of the following or may be learned by practice of the disclosure. The advantages of the disclosure may be realized and attained by means of the instrumentalities and combinations particularly pointed out in the appended claims.

DETAILED DESCRIPTION

Figure 1:
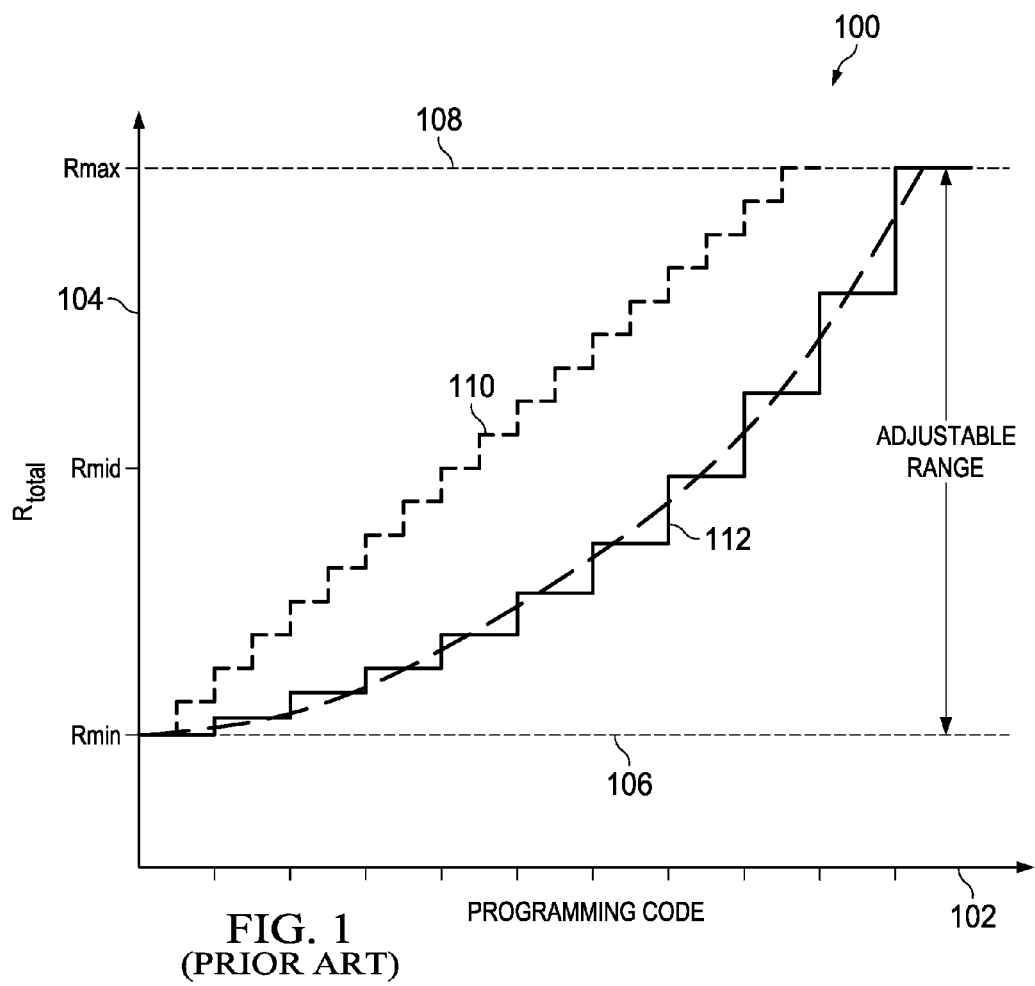
FIG. 1 shows a graph which illustrates the basic responses of a micro-step resistance network.

An aspect of the present disclosure is drawn to the implementation of a series-structure micro-step resistance network using a series array that contains a plurality of tapped resistance stages, each stage having a series switch accompanying a resistor. Each resistance stage connects in parallel with another switch that is part of a series switch array. A programming code is applied to the switch array through inverting components and the programming code is also applied to resistance stage switches but without inversion. This implementation is an improvement over a conventional series-structure micro-step resistance network in that the adverse effects of switch on-resistance are greatly mitigated.

A second aspect of the present disclosure is drawn to the implementation of a 2-bit parallel-structure micro-step resistance network using an array containing a plurality of conventional parallel resistance stages, each stage having a resistor and a switch, except the last stage that has two resistors and two switches. Digital logic is used to apply a programming code for adaptive control of the switches such that the conventional branches are switched conventionally but switching between the two resistors of the last stage is done depending on the state of the first switched branch. This novel technique greatly improves upon the conventional implementation by linearizing the resistance steps. This technique can be extrapolated for more stages but becomes increasingly complex.

A third aspect of the present disclosure is drawn to the implementation of a parallel-structure micro-step resistance network using additional "redundant" switched resistor branches in addition to the conventional branches, the additional resistance levels enabled by the redundant branches being used along with the conventional branch levels to provide a much larger selection of levels. Logic gates are used to convert a conventional programming code into a new programming code which, using a technique known as redundancy interpolation, can choose from the large selection of resistance levels to produce a series of linear steps. This is another technique for significantly improving upon conventional parallel-structure micro-step resistance networks by linearizing the micro-steps. This technique can be used where the adaptive control technique becomes too complex.

A fourth aspect of the present disclosure is drawn to the use of an implementation in accordance with the third aspect of the present disclosure to provide a large selection of resistance levels whereby a series of micro-steps can be chosen which conform to a desired function or curve (which is not necessarily linear). This is a significant improvement to the conventional fixed step parallel-structure micro-step resistance network since it provides a great deal of flexibility to tailor the micro-step network to different applications.

The aspects listed above together represent unique and novel systems and methods which provide solutions to overcome the main problems encountered when using conventional micro-step resistance networks. The solutions cover a large range of implementation structures, network sizes, step functions and applications.

Figure 6:
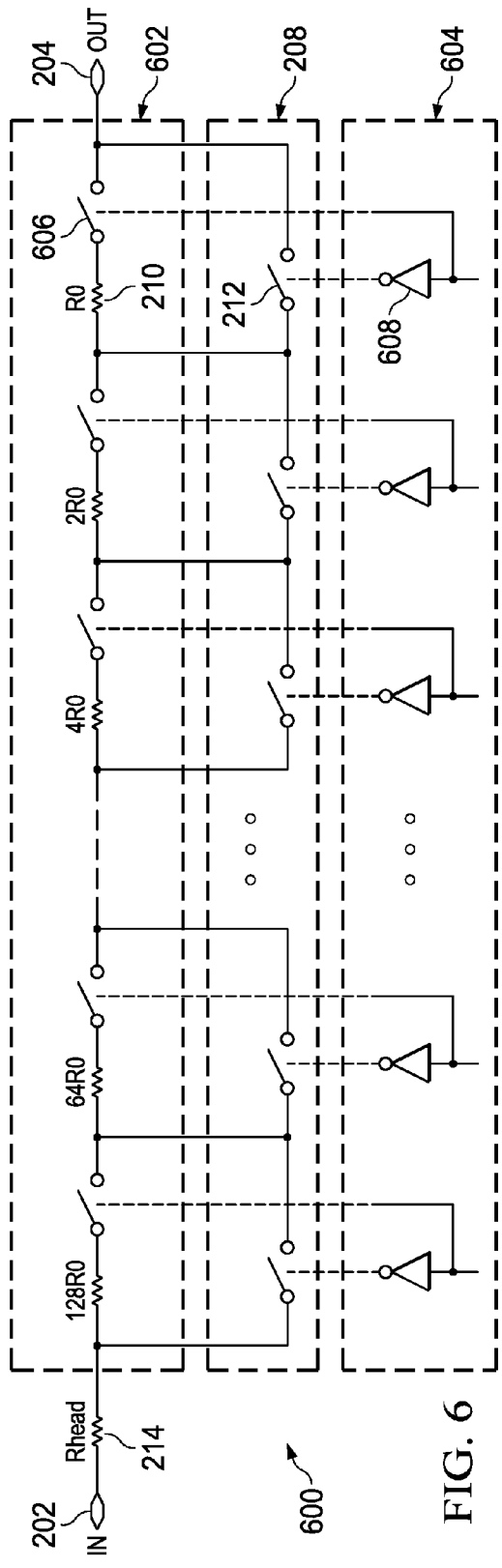
FIG. 6 shows a series structure micro-step resistance network implemented in accordance with aspects of the present disclosure.

FIG. 6 shows circuit 600, a series structure micro-step resistance network implemented in accordance with aspects of the present disclosure.

As shown in the figure, circuit 600 includes input 202, output 204, a tapped resistor array 602, tapped switch array 208, head resistor 214 and a driving array 604. Tapped resistor array includes a plurality of resistors, a sample of which is indicated as resistor 210, and a plurality of switches, a sample of which is indicated as a switch 606. Driving array 604 includes a plurality of inverters, a sample of which is indicated as an inverter 608.

Tapped resistor array 602 is arranged in series with head resistor 214 between input 202 and output 204. The taps of tapped switch array 208 are connected such that each individual switch of tapped switch array 208 is arranged in parallel with its corresponding individual resistor/switch pair of tapped resistor array 602.

Tapped resistor array 602 contains 8 tapped resistor/switch pairs arranged in series, with binary scaled poly resistances. That is, from left side to right side, the resistances are respectively 128*R0, 64*R0, ..., 4*R0, 2*R0 and 1*R0.

Head resistor 214, resistor 210 and all other individual resistors of tapped resistor array 602 are operable to provide electrical resistance to a current. Switch 606 and all the other individual switches of tapped resistor array 602 are operable to provide an electrical connection or disconnection depending on the closed or open state (respectively) of the switch. Switch 212 and all the other individual switches of tapped switch array 208 are operable to provide an electrical connection or disconnection depending on the closed or open state (respectively) of the switch. Inverter 608 and all the other inverters of driving array 604 are operable to provide a single bit digital inversion function.

The functions of the first stage components, i.e., resistor 210, switch 212, switch 606 and inverter 608, can be, in the following description, to be representative of the other stages for tapped resistor array 602, tapped switch array 208 and driving array 604.

Figure 4:
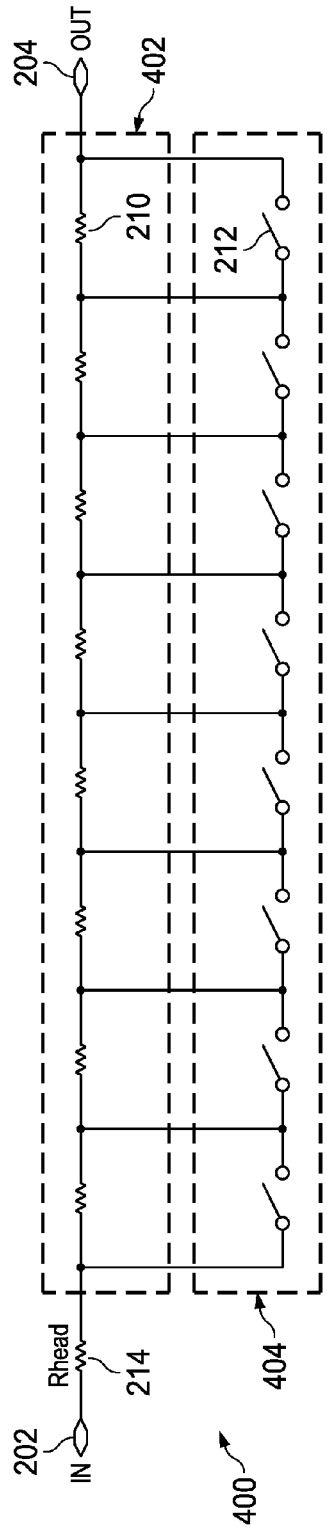
FIG. 4; shows a second alternate example of a conventional micro-step resistance network.

It is important to note that circuit 600 is a modification of circuit 400 of FIG. 4, and is an improved version in accordance with aspects of the present disclosure. For this reason and since the operation of such circuits have already been described, the operation of circuit 600 will therefore be explained in comparison with circuit 400.

As for circuit 400, the resistances for circuit 600 within tapped resistance array 602 are switched in or out of the circuit using the switches of tapped switch array 208 according to a programming code applied to the switches tapped switch array 208. For circuit 600 however, there are additional components. Resistor 210 has a series switch associated with it, switch 606, and this switch is driven with the inverse of the drive signal applied to the parallel switch 212, the inversion function being provided by inverter 608.

When switch 212 is driven open, switch 606 is driven closed and the resistance of resistor 210 is added to the total resistance between input 202 and output 204. When switch 212 is driven closed, switch 606 is driven open and resistor 210 is switched out of the circuit. This is very similar to the conventional operation of circuit 400, but for circuit 600 it is important to note how the on-resistance $R_{SWon}$ of the switches plays into the circuit operation.

For conventional circuit 400, $R_{SWon}$ affects step size accuracy adversely because it is present in only one of the states, i.e., the state where switch 212 is closed and resistor 210 is nominally switched out of the circuit. However, for system 600, a closed switch is present in both states, so switch 212 contributes $R_{SWon}$ in the state where resistor 210 is switched out of the circuit and switch 606 contributes $R_{SWon}$ in the state where resistor 210 is switched into the circuit. Thus, for this stage of the circuit, the net resistance change for the circuit is the resistance of resistor 210 alone. As previously mentioned, the other stages of the circuit behave in the same manner.

It can be seen therefore for circuit 600, that, in accordance with aspects of the present disclosure, the absolute value of $R_{SWon}$ does not contribute to step size error. However any mismatch in $R_{SWon}$ between the switches of a stage, (e.g. switch 212 and switch 606) can produce an error, but this would be much smaller compared an absolute value error of a conventional circuit. Furthermore, any potential mismatch can be easily minimized by ensuring that the switches of identical size and layout and by physically laying them next to each other.

For series-structure micro-step resistance circuits where step size accuracy is of paramount importance but cannot be implemented by conventional means due to unacceptably large switch sizes, implementation in accordance with the aspects of the present disclosure described using circuit 600 can eliminate this problem. On the other hand, the disclosure also has distinct advantages in example embodiments where conventional circuits would also work by significantly reducing the size of the switches for a similar step-size error.

Figure 2:
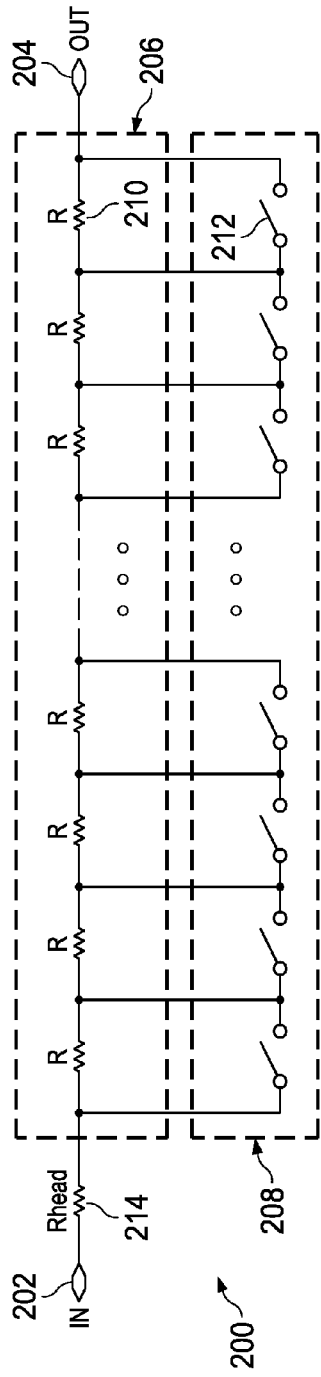
FIG. 2 shows a conventional, basic, linear structure micro-step circuit.
Figure 3:
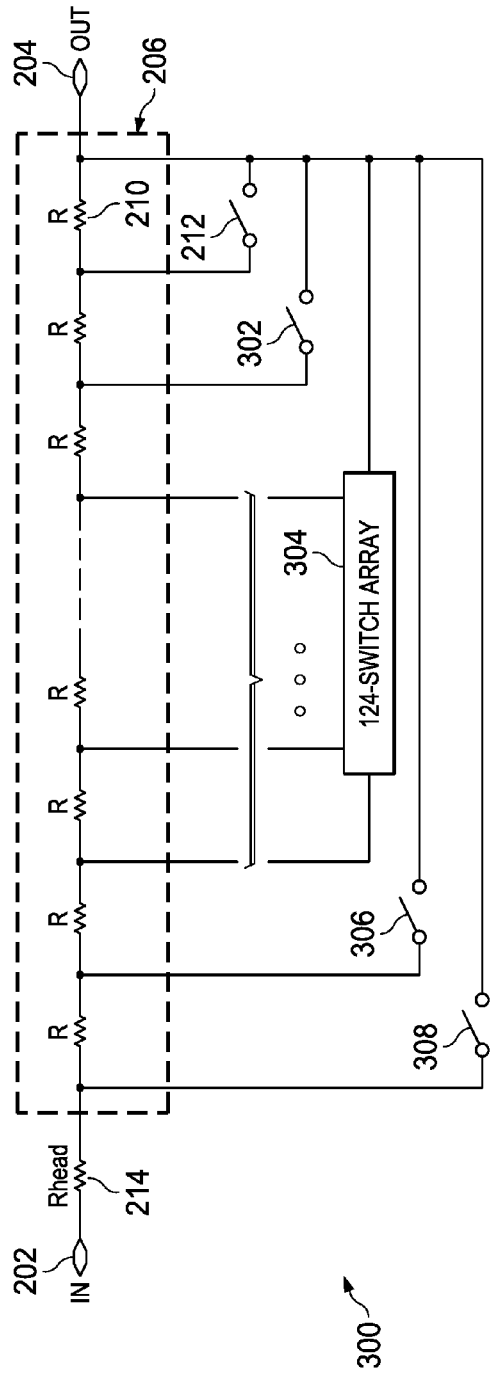
FIG. 3 shows a first alternate example circuit for a conventional micro-step resistance network.

The MOS device mismatching effect is dominated by $V_T$ mismatching. For a similar step-size error as the one described for FIG. 2 by equation (1), i.e., 10Ω, and for a worst case $4\sigma V_T$ deviation, the difference which contributes to step error can be calculated as follows:

$$R_{SWON\_NMOS} - R_{SWON\_NMOS} = \frac{1}{K'_N(W/L) \times \left(V_G - V_S - \left(V_T - \frac{4\sigma_0}{\sqrt{WL}}\right)\right)} - \frac{1}{K'_N(W/L) \times (V_G - V_S - V_T)} = \quad (3)$$

-continued $$\frac{1}{160 \times 10^{-6} \times (W/L)} \left[ \frac{1}{\left(1.8 - 0.9 - \left(0.5 + \frac{4 \times 0.008}{\sqrt{WL}}\right)\right)} - \frac{1}{(1.8 - 0.9 - 0.5)} \right] \le 20\Omega$$

It can be found that a switch of size W/L=9.6 um/0.2 um is good enough for 10 ohm step error, and it is about 16 times less area compared to the prior art. This is because, in addition to that only the $R_{SWon}$ difference contribute to the step error, in the circuit of the present disclosure, increasing switch size W not only reduces the $R_{SWon}$ absolute value but also reduces $V_T$ mismatching level, therefore reduces the net step error contribution. Furthermore, the $V_T$ mismatching is degenerated by NMOS device overdrive voltage $V_{GST}=V_G-V_S-V_T$. A worst case 4σ$V_T$ mismatching means one device $V_T$ is shifted by:

4σ/√WL=4×8 mVum/√9.6um×0.2um=23 mV from the other device, but the overdrive voltage $V_{GST}=V_G-V_S-V_T$ is 400 mV for one device, and it is (400 mV+/−23 mV) for the other device, and it makes the Rswon not very sensitive to $V_T$ variation in equation (3). Thirdly, the series and parallel switches are coupled to the same circuit node so the source nodes potential $V_S$ of these two devices are always at a similar level. Therefore their voltage coefficient (VC) effect on step accuracy is minimized. Similarly, these two switches can be laid out close to each other so their thermal effects are similar and the temperature coefficient effect on step accuracy is also minimized.

In the example embodiment discussed above, circuit 600 includes a plurality of resistors. However, in other embodiments, any or all of the resistors may be replaced with an impedance component, wherein the impedance component may include any one of a resistor, a capacitor, an inductor or a combination thereof.

It has been discussed how the impact of absolute values of $R_{SWon}$ do not contribute to the difference in resistance between switch states of a circuit stage. $R_{SWon}$ does still exist, however, but its contribution is to the resistance of the entire circuit instead of to individual micro-steps. This will be further described with reference to FIG. 7.

Figure 7:
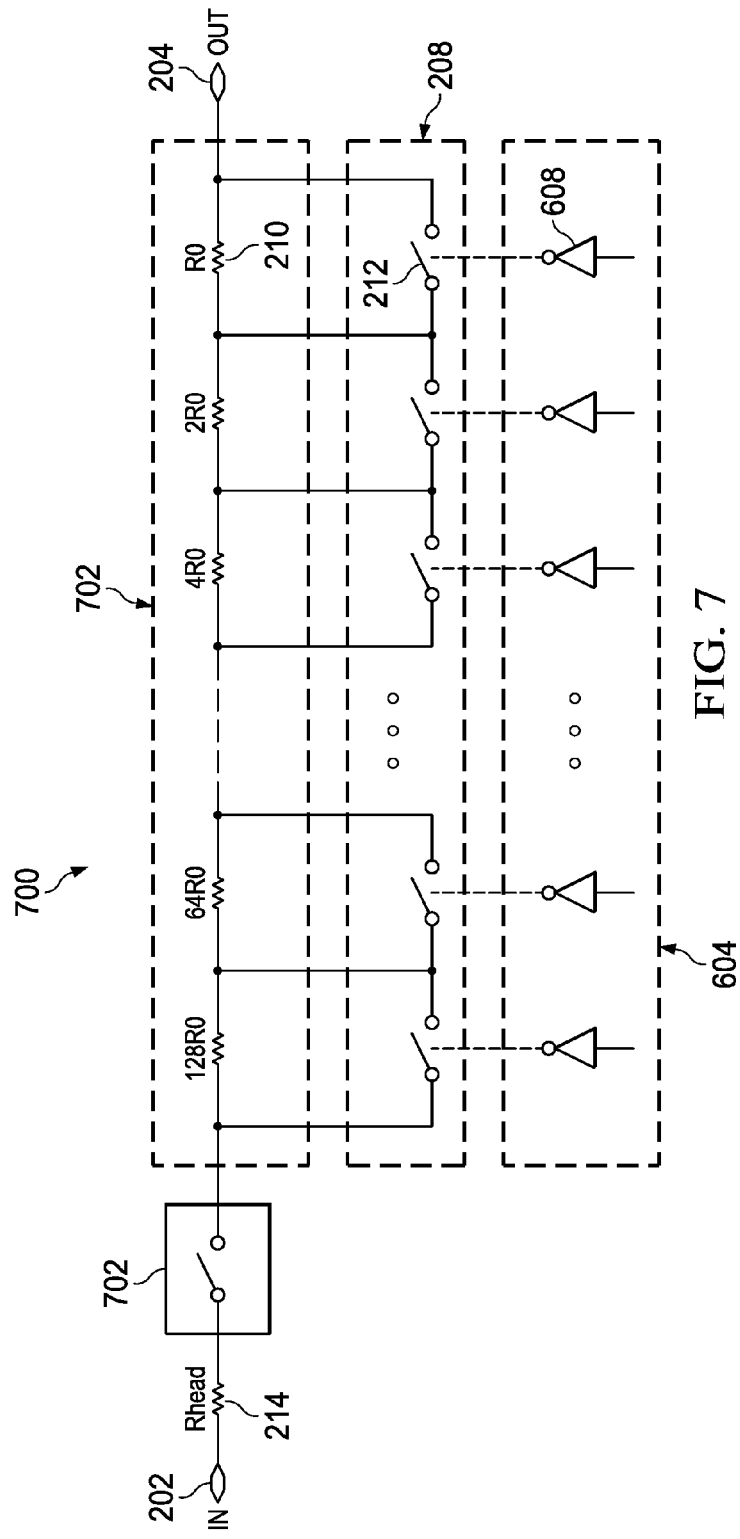
FIG. 7 illustrates; a equivalent series structure micro-step resistance network implemented in accordance with aspects of the present disclosure

FIG. 7 shows an equivalent circuit illustrating the lumped contribution of $R_{SWon}$ to a series structure micro-step resistance circuit implemented in accordance with aspects of the present disclosure.

As shown in the figure, circuit 700 includes input 202, output 204, tapped resistor array 702, tapped switch array 208, driving array 604, resistor 210, switch 212, inverter 608, head resistor 214 and an equivalent switch 702.

Circuit 700 is arranged as in circuit 600 of FIG. 6 except that the series switches of tapped array 602 are replaced with equivalent switch 702 arranged in series with head resistor 214.

Equivalent switch 702 is operable to provide an equivalent resistance to the on-resistances of all closed switches. All other components are operable as described for FIG. 6.

It is important to note that circuit 700 is an equivalent circuit and is not intended to be an operational one. Circuit 700 is resistively equivalent to circuit 600.

In circuit 700, equivalent switch 702 represents the combined $R_{SWon}$ of all the closed switches. FIG. 7 illustrates that the resistance of all the closed switches of tapped array 702 and of tapped switch array 208 of FIG. 6 can be effectively lumped together as a single series resistance and so may be considered part of a head resistance, while the switches in array 208 can be considered as ideal switches with $R_{SWon}$=0, i.e., their on/off operation does not affect the resistance network steps. This is true no matter how many resistors are switched in or out as long as the switches of each stage are driven reciprocally in accordance with aspects of the present disclosure. The total resistance of equivalent switch 702 never changes since only one switch per stage is always closed. As a result, in circuit 600 and its equivalent circuit 700, the switching operation does not affect the resistance steps. The ON-state resistance of all switches can be lumped into equivalent resistance 702. Thus the large size requirement on the switch design, for smaller $R_{SWon}$ and less impact on resistance steps as in the prior art, can be greatly alleviated.

To this point, series-structure micro-step resistance circuits in accordance with aspects of the present disclosure have been described. Conventional parallel-structure circuits also exhibit undesirable behavior, in that they produce nonlinear steps as has been discussed with reference to FIGS. 5A-B. Implementations in accordance with aspects of the present disclosure can correct the nonlinearity and these will now be described with reference to FIGS. 8-12.

Figure 8:
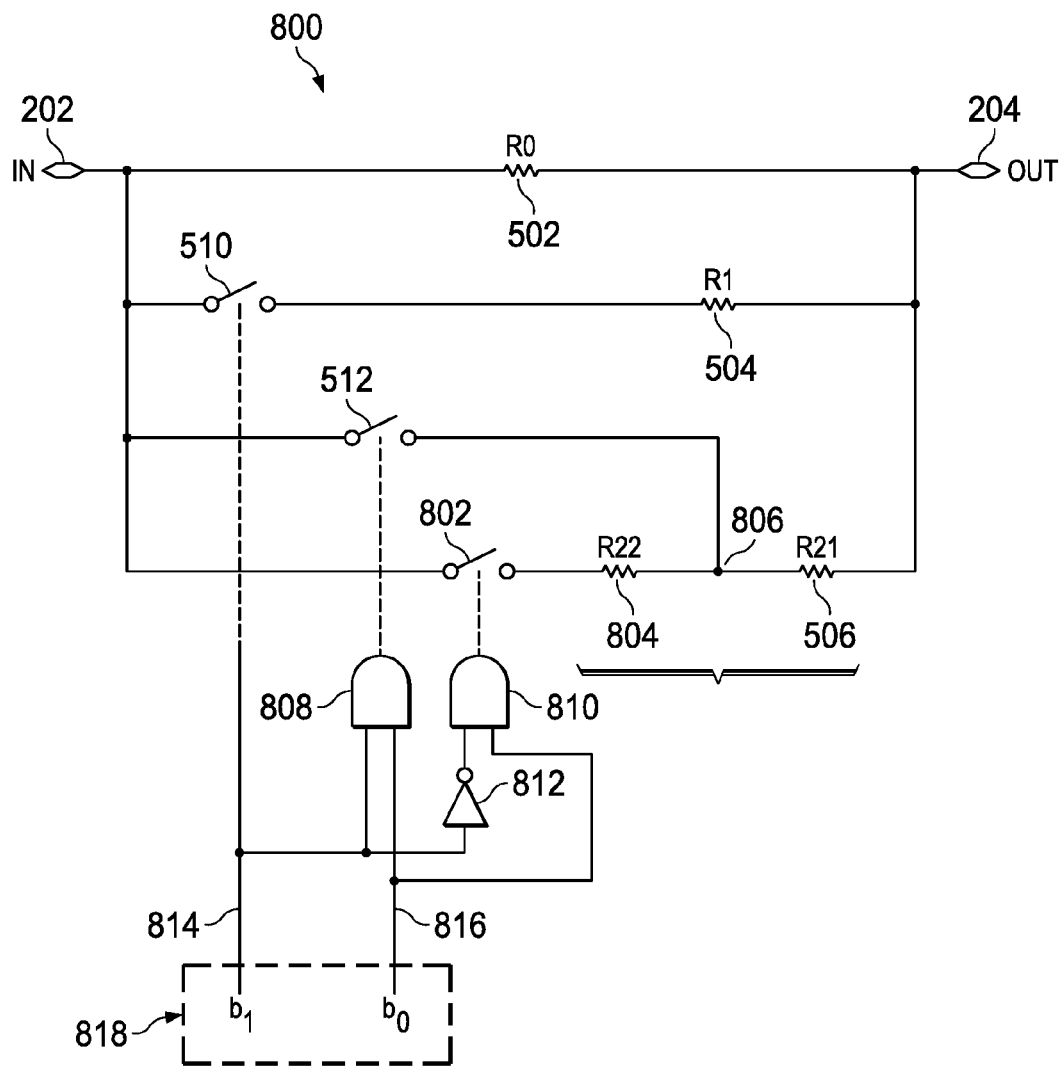
FIG. 8 shows a 2-bit parallel structure micro-step resistance network implemented in accordance with aspects of the present disclosure.

FIG. 8 shows a 2-bit parallel structure micro-step resistance network circuit 800 implemented in accordance with aspects of the present disclosure.

As shown in the figure, circuit 800 includes input 202, output 204, resistor 502, resistor 504, switch 510, switch 512, a switch 802, a resistor 804, resistor 506, an AND-gate 808, an AND-gate 810 and an inverter 812. For purposes of discussion, in this example embodiment, input 202 may be considered an impedance component input and output 204 may be considered an impedance component output, wherein circuit 800 may be considered in its entirety as an impedance component.

Resistor 502, resistor 504 and resistor 804 are arranged in parallel with each other between input 202 and output 204. A node 806 forms the junction between switch 512 and resistor 506. Switch 802 is arranged in series with resistor 804 and together they are arranged between node 806 and input 202.

A programming code 818 is arranged to be applied to the circuit via a line 814 and a line 816. As such, line 814 may be considered an impedance component programming code line and line 816 may be considered an impedance component programming code line. Line 814 connects to switch 510 directly, to switch 512 through AND-gate 808, and to switch 802 through inverter 812 and AND-gate 810. Line 816 connects to switch 512 through AND-gate 808 and connects to switch 802 through AND-gate 810.

Resistors 502, 504, 804 and 506 are operable to provide electrical resistance to a current. Switches 510, 512, and 802 are operable to provide an electrical connection or disconnection depending on the closed or open state (respectively) of the switch. In this example embodiment, resistor 502, resistor 504, switch 510, switch 512, a switch 802, a resistor 804 and resistor 506 may be considered a controllable impedance component.

AND-gates 808 and 810 are operable to provide a logic AND function for two inputs and inverter 812 is operable to provide a logic inversion function. In this example embodiment, AND-gate 808, AND-gate 810 and inverter 812 may be considered a controlling component.

Figure 5A:
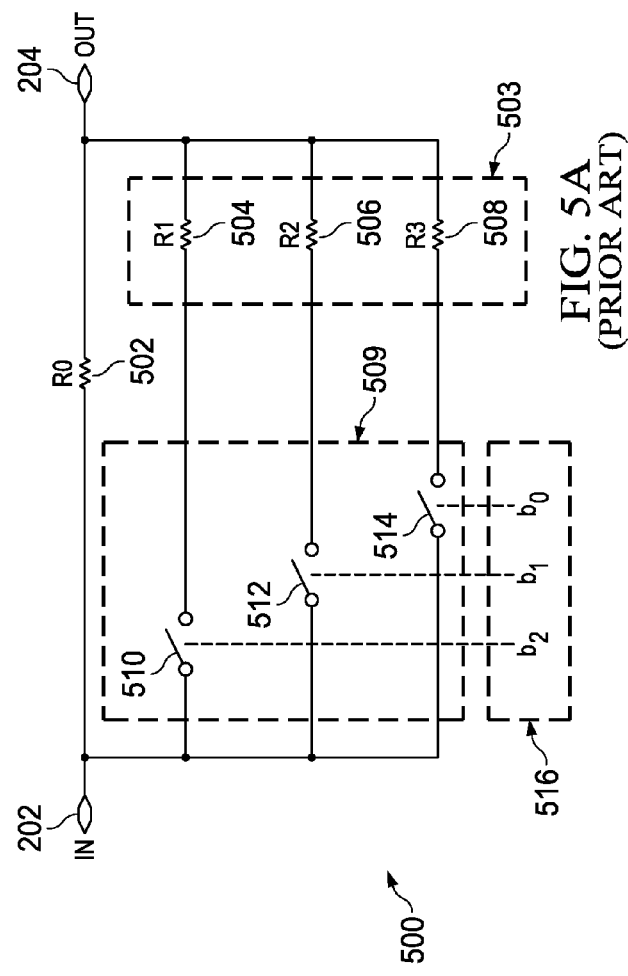
FIG. 5A shows a conventional 3-bit parallel micro-step resistor network.
Figure 5B:
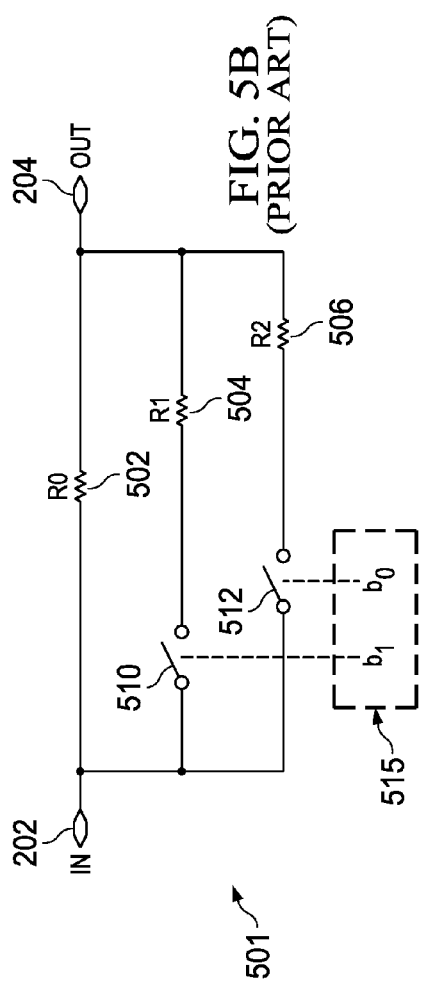
FIG. 5B shows a conventional 2-bit parallel micro-step resistor network.

Circuit 800 should be compared to a conventional 2-bit parallel micro-step network, i.e., circuit 501 of FIG. 5B discussed above.

In operation, circuit 800 works in a similar manner to circuit 501 in that switches are used to switch resistors in and out of contributing to the overall resistance between input 202 and output 204. Circuit 800 differs from circuit 501 in that the third branch of the circuit consisting of switch 512 and resistor 506 has an additional resistance, provided by resistor 804, which can be switched in or out of the branch using switch 802. Circuit 800 also has additional logic formed by AND-gate 808, AND gate 810 and inverter 812 and this is used to drive the three switches using a 2-bit code as opposed to the code being applied directly to the two switches of circuit 501. A major aspect of the present disclosure is that for the third branch of the circuit, switch 512 and switch 802 are used to adaptively control the resistive contributions of resistors 506 (R21) and 804 (R22) depending on the status of switch 510 (SW1).

For a target linear step of $\Delta\Omega$, the following expressions describe the circuit behavior for all values of the programming code and corresponding states of switches 510 (SW1), 512 (SW21) and 802 (SW2):
With all switches off:

$$b[1:0] = '00' \Rightarrow \frac{1}{R_{\mathit{eff}}[00]} = \frac{1}{R0} \tag{4}$$

Where $R_{\mathit{eff}}[00]$ denotes the effective resistance between input 202 and output 204 when programming bit $b[1:0]={'00'}$. The next resistance step level $R0-\Delta$ is generated with switch 802 (SW2) on and the other switches off:

$$b[1:0] = '01' \Rightarrow \frac{1}{R_{\mathit{eff}}[01]} =$$

$$\frac{1}{R0-\Delta} = \frac{1}{R0} + \frac{1}{R2[01]} = \frac{1}{R0} + \frac{1}{R21+R22}, \text{thus} \tag{5}$$

$$R2[01] = R21 + R22 = \frac{R_0^2}{\Delta} - R_0$$

The next resistance step level $R0-2\Delta$ is generated with switch 510 (SW1) on and the other switches off:

$$b[1:0] = '10' \Rightarrow \frac{1}{R_{\mathit{eff}}[10]} = \frac{1}{R0-2\Delta} = \frac{1}{R0} + \frac{1}{R1}, \text{thus} \tag{6}$$

$$R1 = \frac{R_0^2}{2\Delta} - R_0$$

The next resistance step level $R0-3\Delta$ is generated with switch 510 (SW1) and switch 512 (SW21) on and switch 802 (SW2) off:

$$b[1:0] = '11' \Rightarrow \frac{1}{R_{\mathit{eff}}[11]} = \tag{7}$$

$$\frac{1}{R0-3\Delta} = \frac{1}{R0} + \frac{1}{R1} + \frac{1}{R2[11]} = \frac{1}{R0} + \frac{1}{R1} + \frac{1}{R21}, \text{thus}$$

$$R2[11] = R21 = \frac{R_0^2}{\Delta} - 5R_0 + 6\Delta$$

Then combining equation (5) and equation (7) we obtain:

$$R22 = R2[01] - R21 = 4R_0 - 6\Delta \tag{8}$$

In above equations (4) through (8), the programming branch R2 actually has two values R2[01] and R2[11]. The choice of either R2[01] or R2[11] depends on switch 510 (SW1) on/off status. Specifically, R2[01] means the R2 branch resistance (R2[01]=R21+R22) when b1 is programmed to '0', which is realized by turning on switch 802 (SW2) and turning off switch 512 (SW21). R2[11] means the R2 branch resistance (R2[11]=R21) when programming b1 to '1', which is realized by turning on switch 512 (SW21) and turning off switch 802 (SW2). All above operations are realized by the logic gates in FIG. 8.

In another embodiment, the 2-bit linear step parallel-structure network can be extended to 3-bit or higher bit network. The following expressions (9) through (16) describe the behavior of the circuit for all values of programming code:

$$b[2:0] = '000' \Rightarrow \frac{1}{R_{eq}[000]} = \frac{1}{R_0} \tag{9}$$

$$b[2:0] = '001' \Rightarrow \frac{1}{R_{eq}[001]} = \tag{10}$$

$$\frac{1}{R_0-\Delta} = \frac{1}{R_0} + \frac{1}{R_3[001]} \Rightarrow R_3[001] = \frac{R_0^2}{\Delta} - R_0$$

$$b[2:0] = '010' \Rightarrow \frac{1}{R_{eq}[010]} = \tag{11}$$

$$\frac{1}{R_0-2\Delta} = \frac{1}{R_0} + \frac{1}{R_2[010]} \Rightarrow R_2[010] = \frac{R_0^2}{2\Delta} - R_0$$

$$b[2:0] = '011' \Rightarrow \frac{1}{R_{eq}[011]} = \frac{1}{R_0-3\Delta} = \tag{12}$$

$$\frac{1}{R_0} + \frac{1}{R_2[010]} + \frac{1}{R_3[011]} \Rightarrow R_3[011] = \frac{R_0^2}{\Delta} - 5R_0 + 6\Delta$$

$$b[2:0] = '100' \Rightarrow \frac{1}{R_{eq}[100]} = \tag{13}$$

$$\frac{1}{R_0-4\Delta} = \frac{1}{R_0} + \frac{1}{R_1[100]} \Rightarrow R_1[100] = \frac{R_0^2}{4\Delta} - R_0$$

$$b[2:0] = '101' \Rightarrow \frac{1}{R_{eq}[101]} = \frac{1}{R_0-5\Delta} = \tag{14}$$

$$\frac{1}{R_0} + \frac{1}{R_1[100]} + \frac{1}{R_3[101]} \Rightarrow R_3[101] = \frac{R_0^2}{\Delta} - 9R_0 + 20\Delta$$

$$b[2:0] = '110' \Rightarrow \frac{1}{R_{eq}[110]} = \frac{1}{R_0-6\Delta} = \tag{15}$$

$$\frac{1}{R_0} + \frac{1}{R_1[100]} + \frac{1}{R_2[110]} \Rightarrow R_2[110] = \frac{R_0^2}{2\Delta} - 10R_0 + 24\Delta$$

$$b[2:0] = '111' \Rightarrow \frac{1}{R_{eq}[111]} = \tag{16}$$

$$\frac{1}{R_0-7\Delta} = \frac{1}{R_0} + \frac{1}{R_1[100]} + \frac{1}{R_2[110]} + \frac{1}{R_3[111]} \Rightarrow R_3[111] =$$

$$\frac{R_0^2}{\Delta} - 13R_0 + 42\Delta$$

When comparing equation (4) through equation (8) with expression (9) through expression (16), it can be seen that the parallel-structure network step linearization complexity rises rapidly from 2-bit network to 3-bit network.

In the example embodiment discussed above, circuit 800 includes a plurality of resistors. However, in other embodiments, any or all of the resistors may be replaced with an impedance component, wherein the impedance component may include any one of a resistor, a capacitor, an inductor or a combination thereof.

In another embodiment, a different method for parallel-structure step linearization is to use redundancy interpolation. If a 3-bit parallel-structure linear-step network with a certain step size specification is required, a 6-bit parallel-structure non-linear step network can be implemented using three extra redundant bits and therefore it will have about eight times finer steps.

Figure 9:
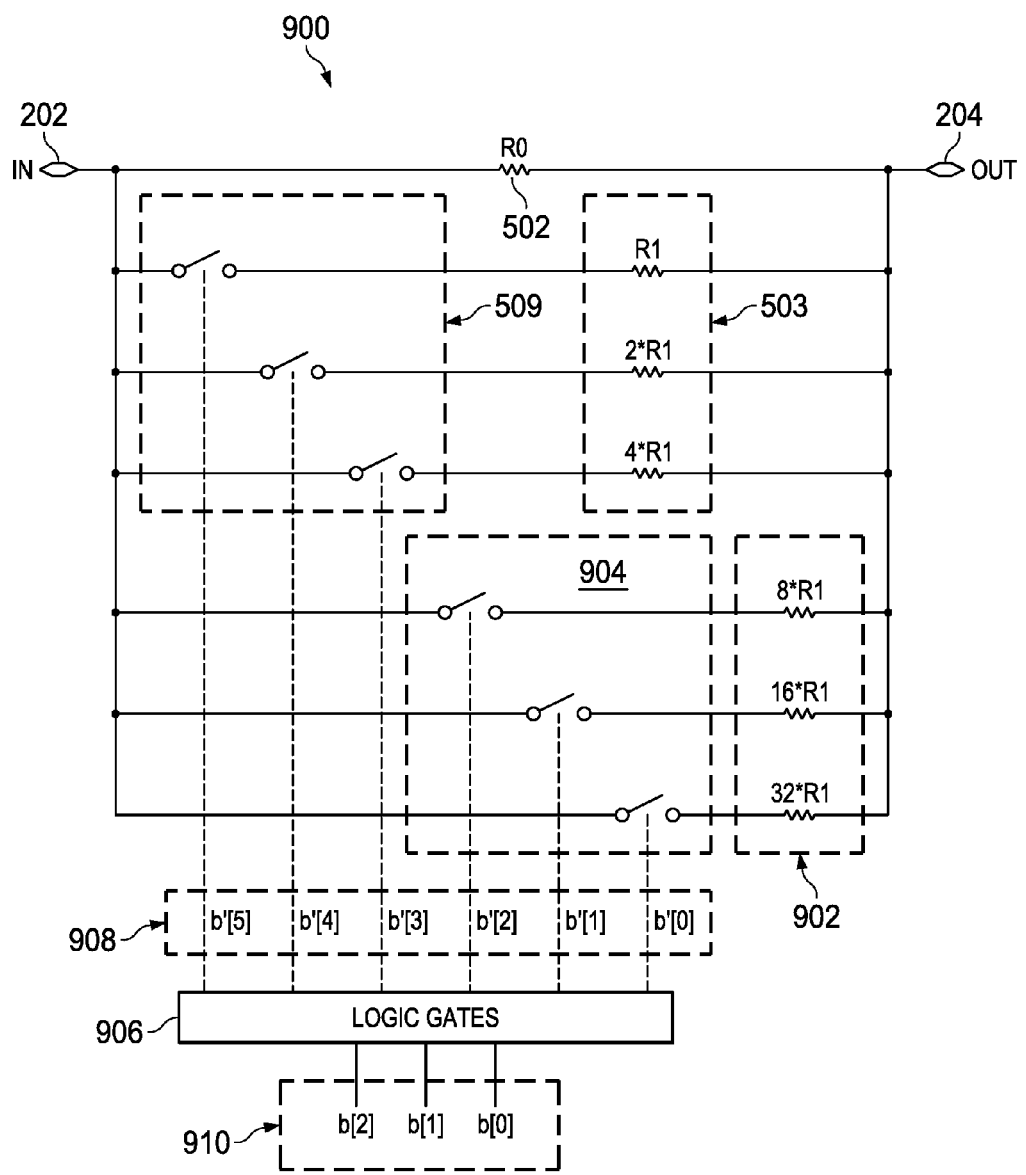
FIG. 9 shows a parallel structure micro-step circuit using redundancy interpolation to linearize the conventional 3-bit circuit in accordance with aspects of the present disclosure.

FIG. 9 shows circuit 900 including a parallel structure micro-step circuit using redundancy interpolation to linearize the conventional 3-bit circuit in accordance with aspects of the present disclosure.

A shown in the figure, circuit 900 includes input 202, output 204, resistor 502, resistor array 503 and switch array 509 which are the components of circuit 500 of FIG. 5A. Circuit 900 also includes a resistor array 902, a switch array 904 and a code logic component 906. For purposes of discussion, in this example embodiment, input 202 may be considered a redundant component input and output 204 may be considered a redundant component output, wherein circuit 900 may be considered in its entirety as a redundant impedance component.

Resistor array 902 and switch array 904 are arranged in the same way as resistor array 503 and switch array 509 and so are also connected between input 202 and output 204. The outputs of code logic component 906 are arranged to connect to the switches of switch array 509 and switch array 904.

Resistor array 902 and switch array 904 operate in the same manner as switch array 503 and switch array 509, respectively. In this example embodiment, resistor array 503, resistor array 902, switch array 509, switch array 904, and resistor 502 may be considered a controllable redundant impedance component, wherein resistor 502 may be considered an initial impedance component.

Code logic component 906 is operable to convert a three-bit input code to six-bit output code.

The parallel branches of resistor 502, resistor array 503 and switch array 509 are the branches of the conventional 3-bit micro-step resistance described in FIG. 5A. For circuit 900, however, these branches are supplemented with three additional "redundant" branches as formed by resistor array 902 and switch array 904. Since there are now six switches to control, a programming code 908 provides the 6-bit code needed. Code logic component 906 converts an original 3-bit programming code (programming code 910) to a 6-bit code, programming code 908.

In operation, code logic component 906 uses the base programming code 516 to produce the non-linear steps of a conventional 3-bit network but then uses the switches of the three additional redundant branches to adjust the steps into linearity by switching in or out the additional redundant resistors. As stated before, the additional redundant branches increase the step resolution by a factor of eight over a 3-bit conventional network and so increases the number of resistance levels to choose from in order to achieve linear steps.

In some embodiments in accordance with aspects of the present disclosure, the conversion function provided by code logic component 906 is fixed in the logic design. In other embodiments the conversion function may be adjustable or variable.

In other embodiments additional redundancy bits can be added for increased step accuracy.

In the example embodiment discussed above, circuit 900 includes a plurality of resistors. However, in other embodiments, any or all of the resistors may be replaced with an impedance component, wherein the impedance component may include any one of a resistor, a capacitor, an inductor or a combination thereof.

The results of operation in accordance with aspects of the present disclosure will now be described with reference to FIG. 10.

Figure 10A:
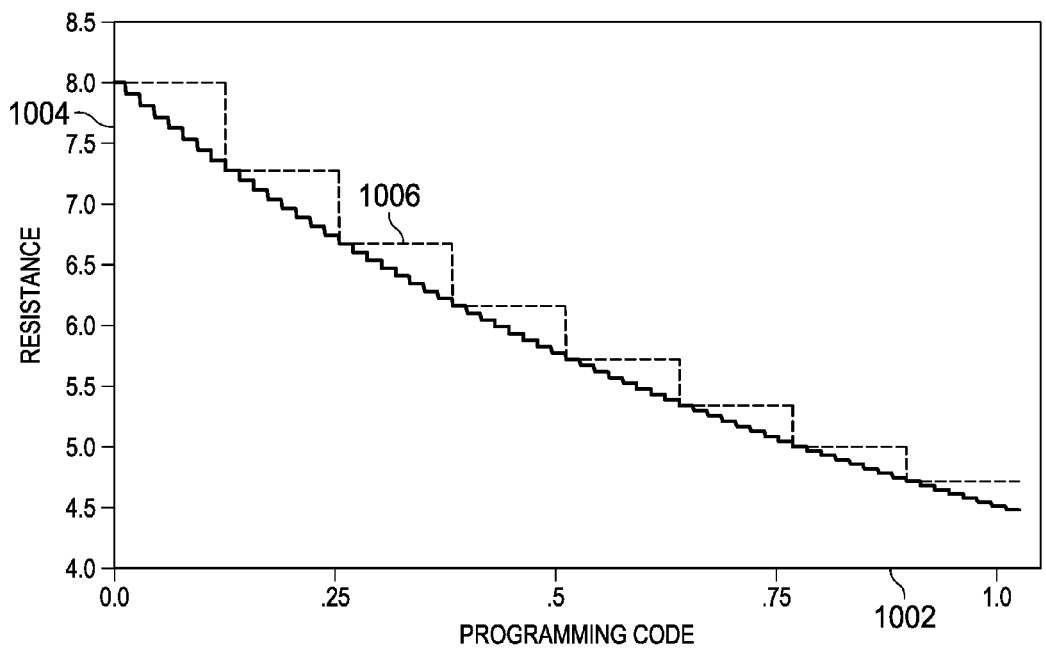
FIGS. 10A-B show micro-step network plots which illustrate the linearity results of a conventional 3-bit parallel-structure micro-step resistance network and those of a 3-bit network with added 3-bit redundancy and redundancy interpolation in accordance with aspects of the present disclosure.
Figure 10B:
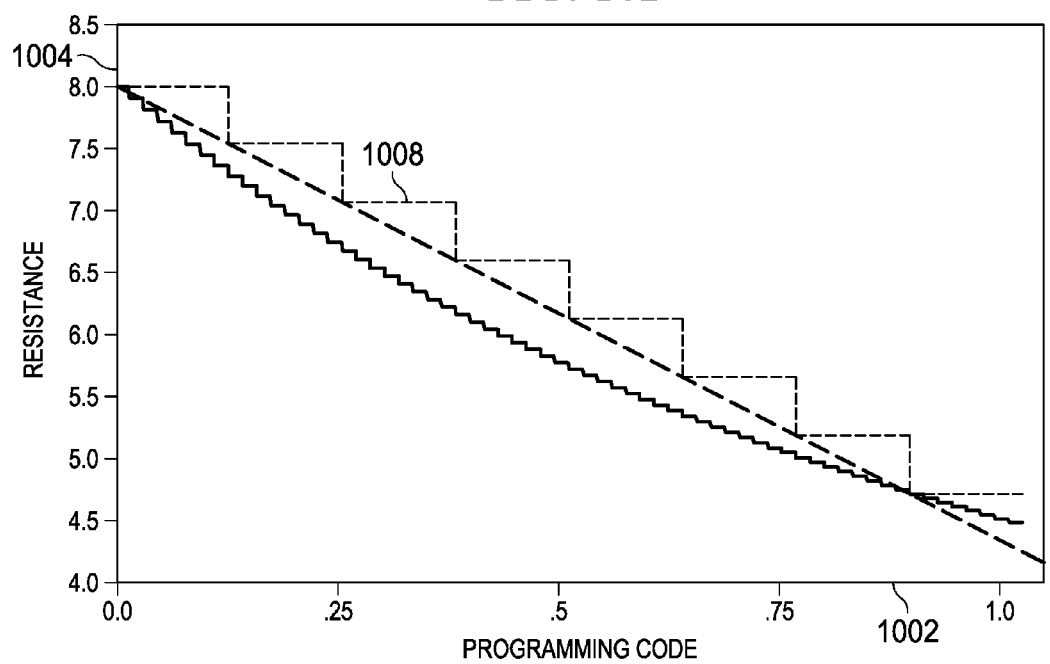

FIG. 10 illustrates micro-step network plots 1000 and 1001, comparing the linearity results of a conventional 3-bit parallel-structure micro-step resistance network with those of a 3-bit network with 3-bit redundancy and redundancy interpolation added in accordance with aspects of the present disclosure.

As shown in the figure, plot 1000 includes an x-axis 1002, a y-axis 1004 and a trace 1006. Plot 1001 includes x-axis 1002, y-axis 1004 and a trace 1008.

X-axis 1002 represents a programming code. Y-axis 1004 represents resistance.

It can be seen from plot 1000 that the riser portions of the steps, i.e., the step size, get smaller as the programming code increases, and that the series of steps follows a curve and so is non-linear.

It can be seen from plot 1001 that the riser portions of the steps, i.e., the step size, remains the same as the programming code increases, and that the series of steps follows a straight line and so is linear.

Plot 1000 is from a conventional 3-bit parallel-structure microstep resistance network whereas plot 1001 is from a 3-bit network enhanced with 3-bit redundancy and redundancy interpolation in accordance with aspects of the present disclosure.

The method described using redundancy interpolation in a parallel-structure network to obtain linear steps can be extended to implement an arbitrary function of resistance steps. One example of an application where this method can be used to great advantage is in implementing a notch filter for a Hard Disk Drive (HDD) Servo IC where the notch filter is used to cancel out the resonance tone generated at a shock sensor. In order to meet the requirement of linear-step-in-log-scale center frequency, the targeted 7-bit, 128 levels (127 steps) resistance should be in an exponential function:

$$R_{(i)} = \frac{1}{2\pi C \times 14.84k} \left(\frac{14.84}{27.56}\right)^{\frac{i}{127}} \quad (17)$$

Such a function can be implemented using a 10-bit (1024-step) resistance network (with 3-bit redundancy) as shown by this expression:

$$R_{(i)} = \sum_{j=0}^{9} b[i,j] \times 2^j R_u = \quad (18)$$
$$b[i,9] \times 512 R_u + b[i,8] \times 256 R_u + \ldots + b[i,1] \times 2 R_u + b[i,0] \times R_u$$

where i=0, 1, 2, 3 . . . 127 is the resistance step count, j=0, 1, 2, 3 . . . 9 is the binary scaled resistance tap count, coefficients b[i, j] can be digitally programmed to either "0" or "1" and should be determined to make the resulting resistance in equation (18) closest to targeted R(i) given in equation (17). The accuracy of the micro-step resistance network, can be improved by adding more redundancy bit, for example, using 11-bit (rather than 10-bit) to implement a 7-bit, 128 step resistance network. In practical design, some alternate combination of series-structure and parallel-structure scheme can be employed, for example, a 6-bit series-structure network combined with a 5-bit parallel-structure network. Some other flexibility exists to achieve circuit performance and the minimum area, as long as the redundancy steps are fine enough to realize required function and step accuracy.

Figure 11A:
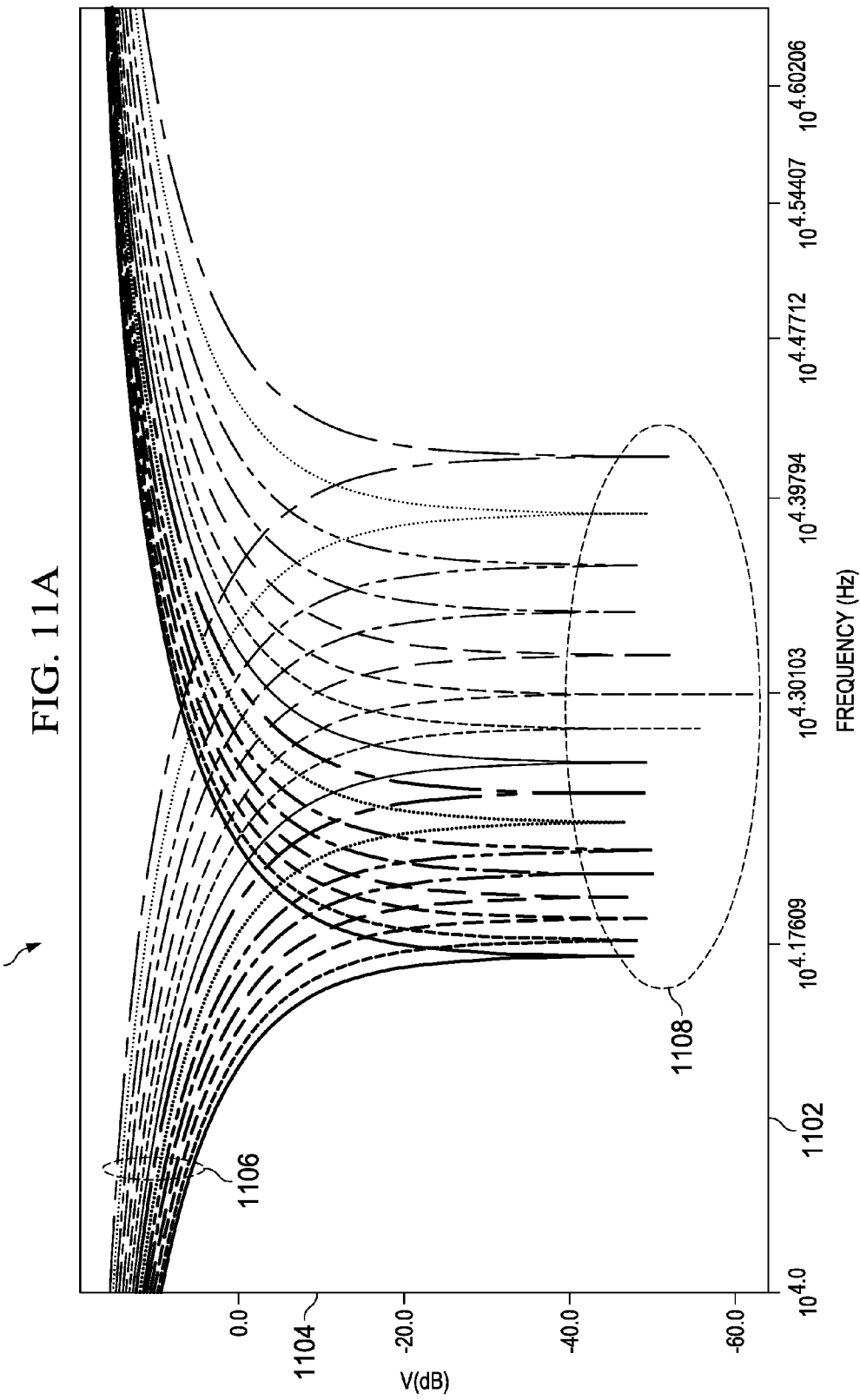
FIGS. 11A-B show two frequency plots for an HDD Servo IC notch filter, illustrating the results for a conventional implementation and an implementation in accordance with aspects of the present disclosure.
Figure 11B:
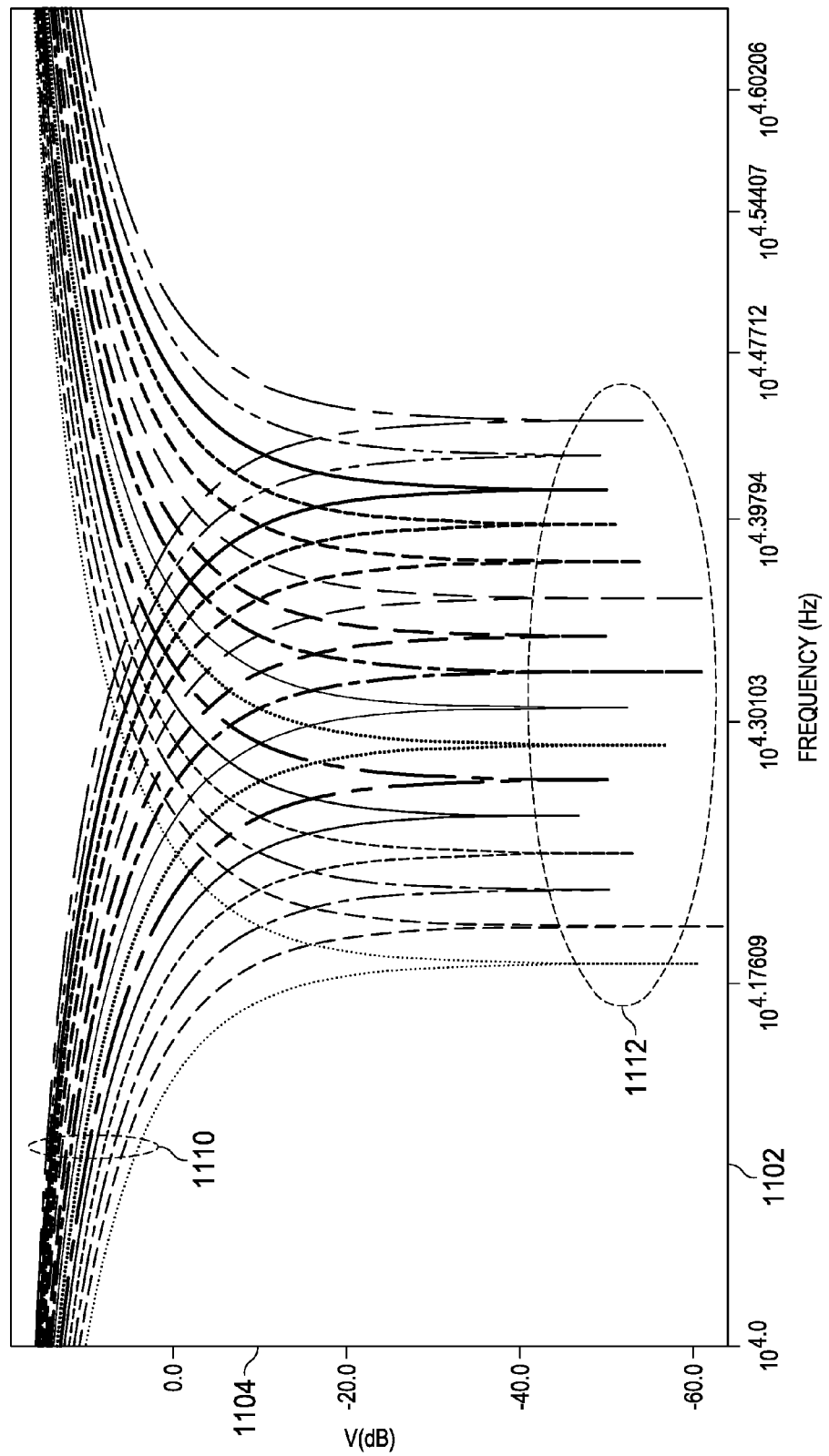

FIG. 11 shows two frequency plots, plot 1100 and plot 1101, for an HDD Servo IC notch filter input/output transfer function characteristic curves, comparing results for a conventional implementation and an implementation in accordance with aspects of the present disclosure as described above.

As shown in the figure, plot 1100 includes an x-axis 1102, a y-axis 1104, a trace series 1106 and a region 1108. Plot 1101 includes an x-axis 1102, a y-axis 1104, a trace series 1110 and a region 1112.

X-axis 1102 represents frequency in log-scale. Y-axis 1104 represents the amplitude of notch filter input/output transfer function.

Plot 1100 is for a notch filter implementation using a prior art linear step micro-step resistance network with $R_{(i)}$ steps to tune center frequency according to $f_{C(i)}=1/(2\pi \times R_{(i)} \times C)$. Each of the dips of trace series 1106 is the center frequency as tuned by each of the $R_{(i)}$ steps. Examination of the dips as seen in region 1108 indicates that while resistance steps are linear, the frequency steps are non-linear i.e., the dips are not the same distance apart. The notch filter effect with this implementation is not optimized.

Plot 1101 is for a notch filter implementation to tune center frequency according to $f_{C(i)}=1/(2\pi \times R_{(i)} \times C)$ with $R_{(i)}$ steps implemented in an exponential function using redundancy interpolation in a parallel-structure network in accordance with aspects of the present disclosure. Each of the dips of trace series 1110 is the center frequency as tuned by each of the $R_{(i)}$ steps. Examination of the dips as seen in region 1112 indicates that the frequency steps are linear (the dips are the same distance apart). The notch filter effect with this implementation is optimized.

Both series-structure and parallel-structure micro-step network implementations in accordance with aspects of the present disclosure have been described above as separate embodiments. In other embodiments these two structure types may be combined into a single network. For example, in one embodiment a resistance network may consist of the series structure of FIG. 7 followed by the parallel structure of FIG. 8 with the output of circuit 700 being connected to the input of circuit 800 to form a single network. This example embodiment is not intended to be limiting. In other embodiments, any combination of any number of structures both conventional and in accordance with aspects of the present disclosure may be combined into a single structure.

As mentioned previously, any or all of the resistors of circuit 600 may be replaced with an impedance component, wherein the impedance component may include any one of a resistor, a capacitor, an inductor or a combination thereof. Further, in some embodiments, any or all of the resistors of circuit 600 may be replaced with a parallel structure micro-step resistance network as discussed above with reference to FIG. 8. Still further, in some embodiments, any or all of the resistors of circuit 600 may be replaced with a parallel structure micro-step circuit using redundancy interpolation as discussed above with reference to FIG. 9.

As mentioned previously, any or all of the resistors of circuit 800 may be replaced with an impedance component, wherein the impedance component may include any one of a resistor, a capacitor, an inductor or a combination thereof. Further, in some embodiments, any or all of the resistors of circuit 800 may be replaced with a series structure micro-step resistance network as discussed above with reference to FIG. 6. Still further, in some embodiments, any or all of the resistors of circuit 800 may be replaced with a parallel structure micro-step circuit using redundancy interpolation as discussed above with reference to FIG. 9.

As mentioned previously, any or all of the resistors of circuit 900 may be replaced with an impedance component, wherein the impedance component may include any one of a resistor, a capacitor, an inductor or a combination thereof. Further, in some embodiments, any or all of the resistors of circuit 900 may be replaced with a series structure micro-step resistance network as discussed above with reference to FIG. 6. Still further, in some embodiments, any or all of the resistors of circuit 900 may be replaced with a parallel structure micro-step resistance network as discussed above with reference to FIG. 8.

It has been explained in this specification how a series-structure micro-step resistance network implementation in accordance with the first aspect of the present disclosure greatly improves upon conventional implementations by compensating for switch on-resistance and thus overcoming the switch size limitations where accurate step sizes are needed. This aspect can also be used in applications where step size accuracy is less important to greatly reduce the micro-step network implementation size.

It has been described how a parallel-structure micro-step resistance network implementation in accordance with the second aspect of the present disclosure greatly improves upon conventional implementations by linearizing the otherwise non-linear steps of a conventional implementation using adaptive control. An implementation in accordance with this aspect is of particular advantage when implementing smaller networks of 2 to 3 bits of resistance programming code.

It has also been described how a parallel-structure micro-step resistance network implementation in accordance with the third aspect of the present disclosure greatly improves upon conventional implementations by linearizing the otherwise non-linear steps of a conventional implementation by using redundancy interpolation. An implementation in accordance with this aspect is of particular advantage when implementing larger networks of more than 2 to 3 bits of resistance programming code.

It has further been explained how a parallel-structure micro-step resistance network implementation in accordance with the third aspect of the present disclosure can also be used to produce steps which conform to a required or desired function or curve. Compared with conventional implementations this is a vast improvement in flexibility, allowing tailoring of micro-step circuits to many diverse applications.

The aspects described above together represent unique and novel systems and methods which provide solutions covering a large range of implementation structures, network sizes, step functions and applications and which overcome the major problems of step accuracy, circuit size, step linearity and step function conformance which are encountered when using conventional micro-step resistance networks.

What is claimed as new and desired to be protected by Letters Patent of the United States is:

1. A system comprising:
an input;
a head impedance component connected to the input;
an output;
a tapped impedance component array connected between the head impedance component and the output, the tapped impedance component array comprising a first tapped impedance component, a second tapped impedance component and a first tapped switch, the first tapped switch connecting the first tapped impedance component and the second tapped impedance component when closed and disconnecting the first tapped impedance component from the second tapped impedance component when open;

a tapped switch array connected between the head impedance component and the output and connected in parallel with the tapped impedance component array, the tapped switch array comprising a second tapped switch connecting the head impedance component and the second tapped impedance component when closed and disconnecting the head impedance component from the second tapped impedance component when open; and a driving array having a first output, an inverter and a second output from the inverter, the first output being connected to the first tapped switch and operable to open and close the first tapped switch, the second output being connected to the second tapped switch and operable to open and close the second tapped switch.

2. The system of claim 1, in which one of the first tapped impedance component and the second tapped impedance component comprises:

an impedance component input;
an impedance component output;
a controllable impedance component having
   a first impedance component connected between the impedance component input and the impedance component output,
   a first impedance component/switch pair connected between the impedance component input and the impedance component output and in parallel with the first impedance component, the first impedance component/switch pair including a second impedance component and a first impedance component switch,
   a second impedance component/switch pair connected between the impedance component input and the impedance component output and in parallel with the first impedance component, the second impedance component/switch pair including a third impedance component and a second impedance component switch, and
   a third impedance component/switch pair connected between the impedance component input and the third impedance component and in parallel with the second impedance component switch, the third impedance component/switch pair including a fourth impedance component and a third impedance component switch;
a first impedance component programming code line operable to receive a first impedance component programming code;
a second impedance component programming code line operable to receive a second impedance component programming code; and
a controlling component having a first controlling component output operable to control the first impedance component switch, a second controlling component output operable to control the second impedance component switch and a third controlling component output operable to control the third impedance component switch, the first impedance controlling output being based on the first impedance component programming code, the second impedance controlling output and the third impedance controlling output being based on the first impedance controlling programming code and the second impedance controlling programming code.

3. The system of claim 2, in which the controlling component comprises:
a first AND gate arranged to output the second controlling component output based on the first impedance component programming code and the second impedance component programming code;

an inverter arranged to output an inverted first impedance component programming code based on the first impedance component programming code; and
a second AND gate arranged to output the third impedance controlling output based on the inverted first impedance component programming code and the second impedance component programming code.

4. The system of claim 3, in which one of the first tapped impedance component, the second tapped impedance component, the first impedance component, the second impedance component, the third impedance component and the fourth impedance component comprises:
a redundant component input;
a redundant component output;
a controllable redundant resistance component having
   an initial impedance component connected between the redundant component input and the redundant component output, and
   a plurality, n, of redundant impedance component/switch pairs, each redundant impedance component/switch pair being connected in parallel between the redundant component input and the redundant component output and in parallel with the initial impedance component, each impedance component/switch pair having a respective redundant impedance component connected in series with a respective redundant switch, in which n is a positive integer greater than or equal to two;
n/2 programming code lines, each being operable to provide a respective programming code; and
a controlling component operable to control the n redundant switches based on the n/2 programming codes from the n/2 programming code lines.

5. The system of claim 4, in which one of the first tapped impedance component, the second tapped impedance component, the first impedance component, the second impedance component, the third impedance component and the fourth impedance component, the initial impedance component and a redundant impedance component comprises one of the group consisting of a resistor, a capacitor, an inductor and a combination thereof.

6. The system of claim 5, in which one of the first tapped impedance component, the second tapped impedance component, the first impedance component, the second impedance component, the third impedance component and the fourth impedance component, the initial impedance component and a redundant impedance component comprises a resistor.

7. The system of claim 2, in which one of the first tapped impedance component, the second tapped impedance component, the first impedance component, the second impedance component, the third impedance component and the fourth impedance component comprises:
a redundant component input;
a redundant component output;
a controllable redundant resistance component having
   an initial impedance component connected between the redundant component input and the redundant component output, and
   a plurality, n, of redundant impedance component/switch pairs, each redundant impedance component switch pair being connected in parallel between the redundant component input and the redundant component output and in parallel with the initial impedance component, each impedance component/switch pair having a respective redundant impedance component connected in series with a respective redundant switch, in which n is a positive integer greater than or equal to two;

n/2 programming code lines, each being operable to provide a respective programming code; and a controlling component operable to control the n redundant switches based on the n2 programming codes from the n/2 programming code lines.

8. The system of claim 7, in which one of the first tapped impedance component, the second tapped impedance component, the first impedance component, the second impedance component, the third impedance component, the fourth impedance component, the initial impedance component and a redundant impedance component comprises one of the group consisting of a resistor, a capacitor, an inductor and a combination thereof.

9. The system of claim 8, in which one of the first tapped impedance component, the second tapped impedance component, the first impedance component, the second impedance component, the third impedance component, the fourth impedance component, the initial impedance component and a redundant impedance component comprises a resistor.

10. The system of claim 1, in which one of the first tapped impedance component and the second tapped impedance comprises:
   a redundant component input;
   a redundant component output;
   a controllable redundant resistance component having
      an initial impedance component connected between the redundant component input and the redundant component output, and
      a plurality, n, of redundant impedance component/switch pairs, each redundant impedance component/switch pair being connected in parallel between the redundant component input and the redundant component output and in parallel with the initial impedance component, each impedance component/switch pair having a respective redundant impedance component connected in series with a respective redundant switch, in which n is a positive integer greater than or equal to two;
   n/2 programming code lines, each being operable to provide a respective programming code; and
   a controlling component operable to control the n redundant switches based on the n/2 programming codes from the n/2 programming code lines.

11. The system of claim 10, in which one of the first tapped impedance component, the second tapped impedance, the initial impedance component and a redundant impedance component comprises one of the group consisting of a resistor, a capacitor, an inductor and a combination thereof.

12. The system of claim 11, in which one of the first tapped impedance component, the second tapped impedance component, the initial impedance component and a redundant impedance component comprises a resistor.

13. A system comprising:
   an impedance component input;
   an impedance component output;
   a controllable impedance component having
      a first impedance component connected between the impedance component input and the impedance component output,
      a first impedance component/switch pair connected between the impedance component input and the impedance component output and in parallel with the first impedance component, the first impedance component/switch pair including a second impedance component and a first impedance component switch,
      a second impedance component/switch pair connected between the impedance component input and the impedance component output and in parallel with the first impedance component, the second impedance component/switch pair including a third impedance component and a second impedance component switch, and
      a third impedance component/switch pair connected between the impedance component input and the third impedance component and in parallel with the second impedance component switch, the third impedance component/switch pair including a fourth impedance component and a third impedance component switch;
   a first impedance component programming code line operable to receive a first impedance component programming code;
   a second impedance component programming code line operable to receive a second impedance component programming code; and
   a controlling component having a first controlling component, output operable to control the first impedance component switch, a second controlling component output operable to control the second impedance component switch and a third controlling component output operable to control the third impedance component switch, the first impedance controlling output being based on the first impedance component programming code, the second impedance controlling output and the third impedance controlling output being based on the first impedance controlling programming code and the second impedance controlling programming code.

14. The system of claim 13, in which the controlling component comprises:
   a first AND gate arranged to output the second controlling component output based on the first impedance component programming code and the second impedance component programming code;
   an inverter arranged to output an inverted first impedance component programming code based on the first impedance component programming code; and
   a second AND gate arranged to output the third impedance controlling output based on the inverted first impedance component programming code and the second impedance component programming code.

15. The system of claim 14, in which one of the first impedance component, the second impedance component, the third impedance component and the fourth impedance component comprises:
   a redundant component input;
   a redundant component output;
   a controllable redundant resistance component having
      an initial impedance component connected between the redundant component input and the redundant component output, and
      a plurality, n, of redundant impedance component/switch pairs, each redundant impedance component/switch pair being connected in parallel between the redundant component input and the redundant component output and in parallel with the initial impedance component, each impedance component/switch pair having a respective redundant impedance component connected in series with a respective redundant switch, in which n is a positive integer greater than or equal to two;

n/2 programming code lines, each being operable to provide a respective programming code; and a controlling component operable to control the n redundant switches based on the n/2 programming codes from the n/2 programming code lines.

16. The system of claim 15, in which one of the first impedance component, the second impedance component, the third impedance component, the fourth impedance component, the initial impedance component and a redundant impedance component comprises one of the group consisting of a resistor, a capacitor, an inductor and a combination thereof.

17. The system of claim 16, in which one of the first impedance component, the second impedance component, the third impedance component, the fourth impedance component, the initial impedance component and a redundant impedance component comprises a resistor.

18. The system of claim 13, in which one of the first impedance component, the second impedance component, the third impedance component and the fourth impedance component comprises:

a redundant component input;

a redundant component output;

a controllable redundant resistance component having an initial impedance component connected between the redundant component input and the redundant component output, and a plurality, n, of redundant impedance component/switch pairs, each redundant impedance component/switch pair being connected in parallel between the redundant component input and the redundant component output and in parallel with the initial impedance component, each impedance component/switch pair having a respective redundant impedance component connected in series with a respective redundant switch, in which n is a positive integer greater than or equal to two;

n/2 programming code lines, each being operable to provide a respective programming code; and a controlling component operable to control the n redundant switches based on the n/2 programming codes from the n/2 programming code lines.

19. The system comprising:

a redundant component input;

a redundant component output;

a controllable redundant resistance component having an initial impedance component connected between the redundant component input and the redundant component output, and a plurality, n, of redundant impedance component/switch pairs, each redundant impedance component/switch pair being connected in parallel between the redundant component input and the redundant component output and in parallel with the initial impedance component, each impedance component/switch pair having a respective redundant impedance component connected in series with a respective redundant switch, in which n is a positive integer greater than or equal to two;

n/2 programming code lines, each being operable to provide a respective programming code; and a controlling component operable to control the n redundant switches based on the n/2 programming codes from the n/2 programming code lines.

20. The system of claim 19, in which one of the redundant impedance components comprises a resistor.

* * * * *